United States Patent [19]
Wolf

[11] 4,367,368
[45] Jan. 4, 1983

[54] SOLAR CELL

[75] Inventor: Martin Wolf, Princeton, N.J.

[73] Assignee: University Patents Inc., Norwalk, Conn.

[21] Appl. No.: 264,158

[22] Filed: May 15, 1981

[51] Int. Cl.³ .......................................... H01L 31/06
[52] U.S. Cl. .................................. 136/255; 136/256; 357/30
[58] Field of Search ................... 136/255, 256; 357/30

[56] References Cited

U.S. PATENT DOCUMENTS

| 4,029,518 | 6/1977 | Matsutani et al. | 136/256 |
| 4,322,571 | 3/1982 | Stanbery | 136/255 |

FOREIGN PATENT DOCUMENTS

| 2835136 | 2/1980 | Fed. Rep. of Germany | 136/255 |
| 1447410 | 8/1976 | United Kingdom | 136/255 |

Primary Examiner—Aaron Weisstuch
Attorney, Agent, or Firm—David N. Koffsky; A. Sidney Alpert; Jerome M. Teplitz

[57] ABSTRACT

An improved solar cell structure is described wherein the cell's front region is provided with a plurality of raised structures, each structure comprising a multilayer of a highly doped region and a high-low junction. On these raised structures sit the solar cell's conductive grid. By emplacing the multilayer structure directly underneath the front region metallized conductive grid, the efficiency losses which would have been present had the highly doped region extended entirely or partially across the front layer, are avoided and the high surface recombination velocity associated with the grid is masked.

5 Claims, 2 Drawing Figures

SOLAR CELL

FIELD OF THE INVENTION

This invention relates to semiconductor, solar cells and more particularly to semiconductor solar cell structures designed to exhibit high efficiencies.

DESCRIPTION OF THE PRIOR ART

The "conversion efficiency" of a solar cell is the ratio of the maximum electrical power output to the total solar energy flux incident on the cell. The cell's power output is the product of the cell's output current and voltage at the maximum power point, which is related to the product of the short-circuit current and the open-circuit voltage. In order to maximize conversion efficiency, the short-circuit current and open circuit voltages should be maximized. The short-circuit current is, in most cases, equal to the "light generated current" which is usually proportional to the incident photon flux, the proportionality factor being the "collection efficiency". Both the collection efficiency and the open circuit voltage are determined by device parameters.

The light generated current arises by virtue of the separation, at the pn junction, of electrons and holes which are created in pairs by the photons absorbed inside the cell. The collection efficiency is the measure of the success with which the incident photons are converted into separated charge carriers to give rise to measurable currents in an external circuit. Attributes contributing to high collection efficiencies are: an optical path sufficiently long for most of the available photons to be absorbed; bulk minority carrier lifetimes which are long enough to permit minority carriers to reach the pn junction before they recombine; and minimization of surface recombination.

It is well known that surface recombination velocities at both front and back surfaces of a solar cell have significant influence on the cell's performance. In particular, at the back surface of the solar cell, a very low value of recombination velocity is required for good performance. However, this surface is usually covered by an ohmic contact which presents a very high value of recombination velocity. In the prior art, others have succeeded in reducing this recombination velocity by the utilization of a three-layer structure for the base region. That structure is shown in FIG. 1 and comprises two base layers 12 and 14, one immediately adjacent to the pn junction and lightly p doped, and the other immediately adjacent to the base contact and heavily p+ doped; both the base layers being separated by a narrow, high-low junction layer 16 whose doping varies from the level of the narrow p base layer to that of the heavily doped p+ layer.

The above-described design is effective, when the thickness of the p-layer is significantly smaller than the diffusion length for minority carriers in this layer ("narrow base layer"), and the thickness of the p+ layer is of approximately the same magnitude as the minority carrier diffusion length in this particular layer. The two diffusion lengths will normally differ considerably.

The graded impurity concentration appearing in high-low junction 16 produces an electric field between the two base layers directed in such a way as to force electrons which would tend to leave the narrow base layer 12 in the direction of the base contact, back into narrow base layer 12. Hence, many electrons that are either generated in the narrow base layer 12 by the incident light or injected into that region from the n side of the junction under forward bias, are forced back into the base layer rather than being permitted to travel into more heavily doped p+ base layer 14.

Heavily doped layer 14 is of a thickness which approximates a diffusion length so that electrons which do manage to surmount high-low junction 16 see the bulk recombination of the heavily doped base material rather than the much higher level of surface recombination of the contact at the back of the base region. This structure increases the effective lifetime of electrons and therefore increases the probability of collecting them in the n doped structure.

While it would appear logical to apply the same structure to the front region of the solar cell, this has not turned out to be advantageous. A three-layer structure in the n region would involve a relatively thick upper layer adjacent to the light exposed surface, which layer would be heavily doped and consequently exhibit a high bulk recombination velocity. Thus, even if a surface treatment was applied to the light exposed surface to reduce surface recombination, the bulk recombination exhibited by the heavily doped n+ layer would predominate.

In order to reduce the resistive losses in the solar cell's upper surface, it is common to apply a metal grid structure in electrical contact with the semiconducting upper layer. The spacing of these grid conductors is, in high efficiency solar cells, of similar magnitude as the minority carrier diffusion length. Thus, while it is possible to reduce the surface recombination velocity at the open semiconductor surface between grid conductors to acceptable levels by suitable passivation (such as a charged oxide layer on silicon), the grid contact structure represents a pattern with high surface recombination velocities distributed over the entire front surface. This pattern has a significant degrading effect on the solar cell's performance whenever the grid line spacing is not large in comparison to the minority carrier diffusion length in the front region of the device.

Finally, in any remedy which attempts to reduce the degradation resulting from the surface recombination velocities exhibited by the conductive grid structure, care must be taken not to reduce the light collection area of the semiconductor.

Accordingly, it is an object of this invention to provide a solar cell having an improved efficiency.

It is a further object of this invention to provide an improved solar cell wherein the improvement in efficiency is achieved without a concomitant reduction in light collection area.

SUMMARY OF THE INVENTION

In accordance with the above objects, an improved solar cell structure has been devised wherein the front region is provided with a plurality of raised structures, each structure comprising a multilayer of a highly doped region and a high-low junction. On these raised structures sit the solar cell's front region, conductive grid. By emplacing the multilayer structure directly underneath the front region metallized conductive grid, the efficiency losses which would have been present had the three layer structure extended entirely or partially across the front layer, are avoided and the high surface recombination velocity associated with the grid is masked.

DESCRIPTION OF THE PREFERRED EMBODIMENT

Figure 1:
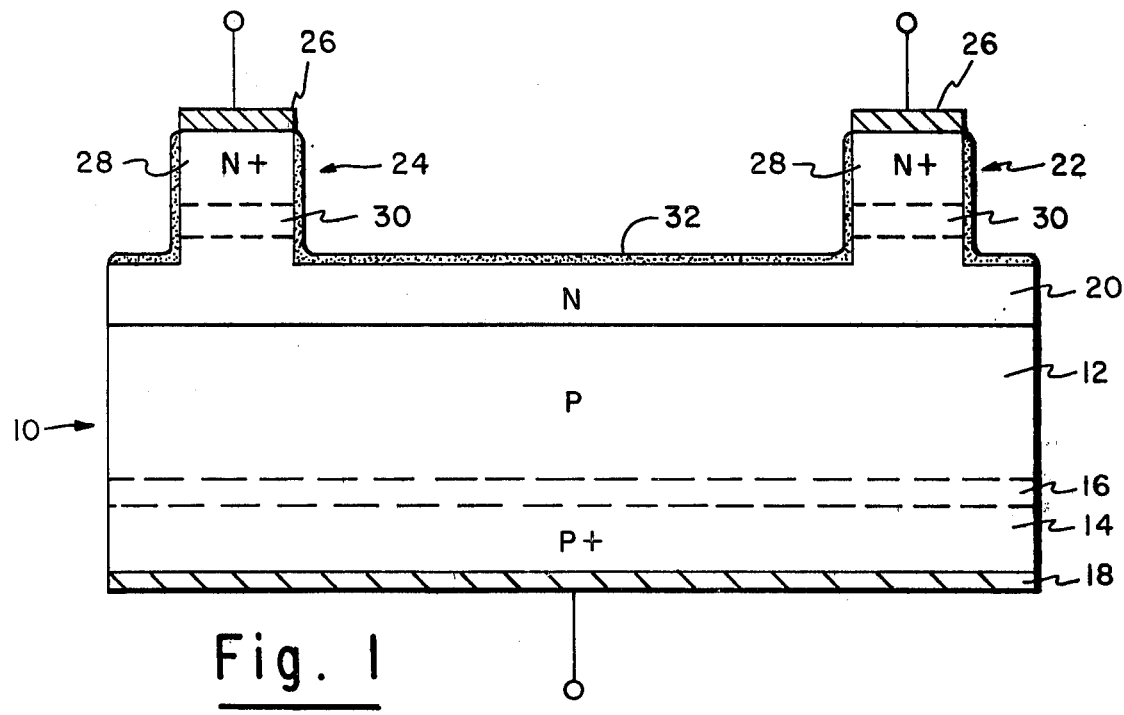
FIG. 1 illustrates a side elevation sectional view of a solar cell embodying the invention.

Referring now to FIG. 1, solar cell 10 is provided with a three layer base region in accordance with the prior art. Specifically, the base region comprises a p layer 12 and p+ layer 14, both of which are separated by high-low junction region 16 (all which may be, for example, silicon). Base layer 12, in the preferred embodiment, is doped to a level in the approximate range of $10^{15}$ to $10^{17}$ impurity atoms per cubic centimeter. The heavily doped layer 14, on the other hand, is doped to a level at least one order of magnitude higher than layer 12. The thickness of layer 12 should be considerably less than the minority carrier diffusion length, whereas the thickness of the heavily doped layer 14 should approximate one diffusion length. The high-low junction is a region where the doping level makes a transition from the level appearing in layer 12 to the level appearing in layer 14. As is normal in such structures, all or part of the back surface of the base region is covered by conductor 18.

The front region of the device comprises an n doped semiconductor layer 20 having raised pedestal regions 22 and 24 which extend up to and support conductors 26 and 28. Pedestals 22 and 24 are, in fact, ridges seen in cross-section which extend across the upper surface of n layer 20 but only cover a small percentage of such upper surface (FIG. 1 is not drawn to scale).

When viewed from the top, pedestal/ridges 22 and 24 and other like structures create a current collection grid on the cell, for connection to bus lines or other contact areas. Each of semiconductor pedestals 22 and 24 is comprised of a heavily doped n+ region 28 which is separated from n region 20 by a high-low junction 30. Junction 30 is much the same as high-low junction 16 in that it is a transition region wherein the doping level decreases from that appearing in n+ region 28 to that appearing in n region 20. (e.g., from $10^{18}$ donors per cubic centimeter in n+ region 28, to $10^{16}$ donors per cubic centimeters in n region 20). As the result of the aforementioned difference in doping, the minority carrier diffusion length in n region 20 is long in comparison with that occurring in n+ region 28. The thickness of n+ region 28 should approximately be one diffusion length of the minority carriers in region 28 and the thickness of region 20 considerably less than the minority carrier diffusion length in region 20. The thickness of high-low junctions 30 should be much smaller than the effective diffusion length of the carriers to prevent minority carrier recombination.

A detailed discussion of the operation of base layers 12, 14 and 16 is contained in "Interactions of Efficiency and Material Requirements for Terrestrial Silicon Solar Cells", by Bowler and Wolf, appearing in the *IEEE Transactions on Components, Hybrids, and Manufacturing Technology*, Vol. CHMT-3, No. 4, pages 464-472, Dec., 1980, the disclosure of which is incorporated herein by reference.

Figure 2:
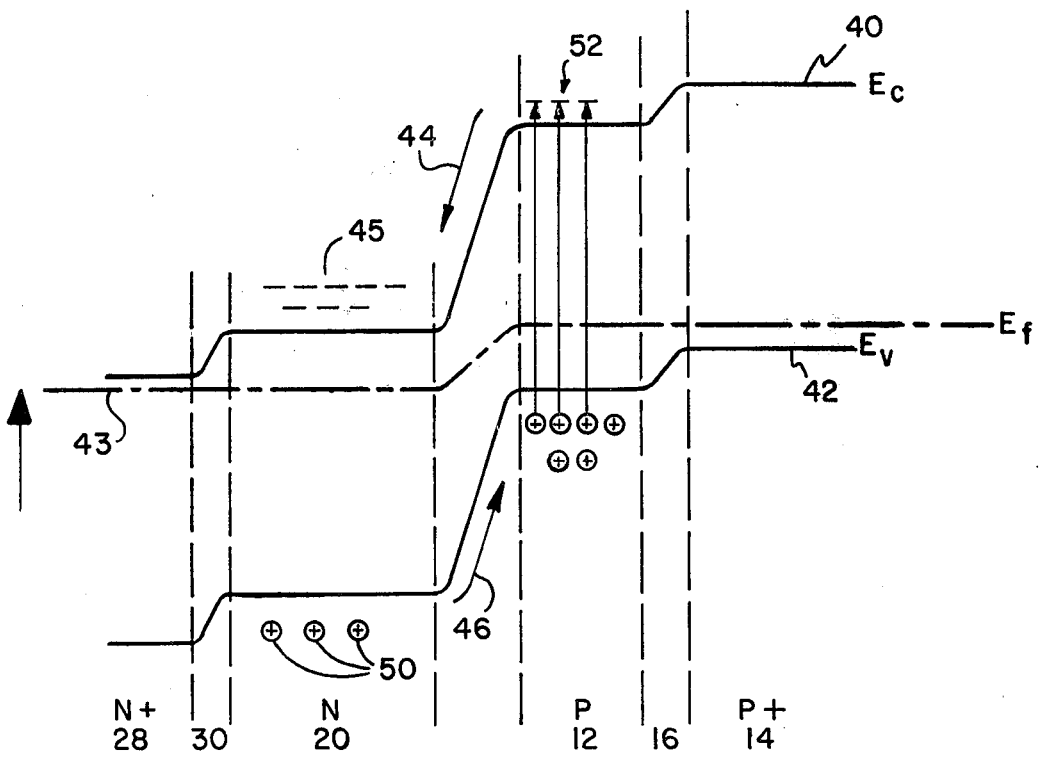
FIG. 2 depicts an energy band diagram helpful in the description of the operation of the device in FIG. 1.

The operation of solar cell 10 will be better understood by referring to the energy band diagram in FIG. 2. Curves 40 and 42 are respectively the energies of the conduction and valence band edges of the semiconductor structure of FIG. 1. The Fermi level 43 of the n type material can be seen to be near the top of the forbidden gap between the valence band 42 and conduction band 40 [with many electrons 45 (majority carriers) in conduction band 40 and a few holes 50 (minority carriers) in the valence band 42]. The opposite is true in the p type material (i.e., holes are majority carriers, electrons—minority carriers, Fermi level near the valence band).

When sunlight strikes the semiconductor, those photons having energy greater than the forbidden gap energy produce both minority and majority carriers in equal numbers. The net effect is that an intense light source can increase the minority carrier density by many orders of magnitude while having a negligible effect on the majority carrier density. On average, excess carriers that are within a diffusion length of the pn junction are "trapped" by the junction and caused to flow across it in an attempt to reduce their energy. Thus, a flow of electrons is seen from the p region into the n region as shown by arrow 44, and a flow of holes from the n region into the p region, as shown by arrow 46. In other words, excess electrons flow from right to left in FIG. 2 whereas excess holes flow from left to right, thus achieving minority carrier current flow.

When electrons enter n region 20 from p region 12, they become majority carriers and travel to conductors 26. In similar fashion, when the holes enter base region 12 from n region 20, they also travel to base contact 18 as majority carriers thereby creating majority carrier current flow within each of the respective n and p regions. However, it is important that holes 50 (FIG. 2), as long as they remain in n region 20, be restrained from travelling to conductors 26 and recombining with the majority carriers (electrons). In similar fashion, it is important to maintain the minority carriers 52 in p region 12 and prevent their travelling to base contact 18 (where a high surface recombination velocity is exhibited).

Whereas in the prior art, high-low junction 16 has been utilized to provide an electrostatic force which would substantially prevent the minority carriers in p region 12 from reaching the conductor 18, no such structure was thought to be practical in the upper region of the solar cell as a result of the electronic properties of such heavily doped n+ region at the uppermost surface of the cell. If the n+ region were to extend completely, or even only a few diffusion lengths, across the top surface of solar cell 10, the high bulk recombination velocity exhibited by such region would greatly reduce the efficiency of the cell, and thus defeat its potential beneficial effects. It has been found that the construction of high-low junctions and n+ regions into individual pedestals (ridges), beneath and supporting the respective grid conductors, substantially reduces the degrading effects hitherto thought to be unavoidable.

High-low junctions 30 provide an electrostatic field which prevents a substantial percentage of the minority carriers (holes) in n region 20 from reaching n+ region 28 and consequently conductors 26 respectively. By making the n+ region 28 about a diffusion length thick, it further shields the minority carriers in n region 20 from the influence of the high surface recombination velocity of the ohmic contact between the semiconductor and the metallization. The described structure enables n region 20 to be substantially isolated from minority carrier current flow to the contacts and, at the same time, provides good ohmic contact with conductors 26. Since the entire upper surface of n+ region 28 does not extend further than conductors 26, no additional loss in efficiency is seen from the structure. This structure can result in a better than 10 percent increase in efficiency (i.e., from ~18% to ~20%) of an otherwise identically constructed, well optimized solar cell.

There are a number of methods for constructing the semiconductor structure of FIG. 1. Initially, n region 20 may be produced so that it extends up to and just below the level of conductors 26. A suitable dopant may be spread upon the upper surface (i.e., Al for a p+ type region, Sb doped Sn for an n+ type region) and the structure subjected to a heat treatment. This will result in the creation of both n+ region 28 and high-low junction 30 by virtue of alloying and crystal regrowth. Subsequently, and after suitable masking, the areas between pedestals 22 and 24 can be etched out using a suitable etchant (i.e., an HF/HNO$_3$ mixture), and surface passivation and anti-reflective coatings applied. While high-low junctions 30 are shown as limited to just the pedestal structures, they (or a portion thereof) can be constructed to extend across the upper surface of the solar cell to provide an electric field which acts to reduce surface recombination velocities.

Pedestal/ridge structures 22 and 24 may alternatively, by the use of suitable masks, be built up from the basic n (or p) structure via epitaxial chemical vapor deposition.

While the structure of FIG. 1 has been described using Silicon as the base material, other appropriate semiconductor materials could be substituted (e.g., GaAs, CdTe, etc.). Additionally, while the solar cell has been described as having a 3 layer base structure, other base structures could be substituted, albeit with a loss in efficiency. Furthermore, while the structure has been shown as having n type front regions and p type base regions, the opposite structure (i.e., p type front regions and n type base regions) is contemplated as being within the scope of this invention.

What is claimed is:

1. A solar cell having base and front regions of opposite conductivity type forming a photovoltaic junction therebetween, the improvement wherein said front region comprises:

a first semiconductor layer extending over the upper surface of said front region, said first layer being doped to one type of conductivity and having a thickness substantially less than the minority carrier diffusion length in said layer;

a plurality of raised structures covering a small percentage of said first semiconductive layer, each of said structures including a second semiconductive layer of said one type which is more heavily doped than said first semiconductive layer, the thickness of each said second semiconductive layer being of the order of the diffusion length of minority carriers in said second layer, each of said second semiconductive layers joined to said first semiconductive layer by a junction region whose doping level varies from that of said first layer to that of said second layer, and conductive means disposed on the uppermost surface of said raised structures.

2. The invention as defined in claim 1, wherein said junction region's thickness is small compared to the diffusion length of minority carriers.

3. The invention as defined in claim 1, wherein said conductive means is a grid of conductors, each conductor covering the uppermost surface of said raised structure.

4. The invention as defined in claim 1, wherein said first and second semiconductor layers exhibit an n type conductivity.

5. The invention as defined in claim 1, wherein said first and second semiconductor layers exhibit a p type conductivity.

* * * * *